US009520942B2

(12) United States Patent
Cao et al.

(10) Patent No.: US 9,520,942 B2
(45) Date of Patent: Dec. 13, 2016

(54) MILLIMETER-WAVE WAVEGUIDE COMMUNICATION SYSTEM

(75) Inventors: Liqiang Cao, Beijing (CN); Qidong Wang, Beijing (CN); Daniel Guidotti, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 260 days.

(21) Appl. No.: 14/379,998

(22) PCT Filed: Feb. 24, 2012

(86) PCT No.: PCT/CN2012/071558
§ 371 (c)(1),
(2), (4) Date: Jan. 16, 2015

(87) PCT Pub. No.: WO2013/123667
PCT Pub. Date: Aug. 29, 2013

(65) Prior Publication Data
US 2015/0215042 A1    Jul. 30, 2015

(51) Int. Cl.
*H04B 10/12*     (2006.01)
*H04B 10/25*     (2013.01)
(Continued)

(52) U.S. Cl.
CPC .......... *H04B 10/2503* (2013.01); *H04B 10/12* (2013.01); *H04B 10/90* (2013.01);
(Continued)

(58) Field of Classification Search
None
See application file for complete search history.

(56) References Cited

U.S. PATENT DOCUMENTS

| 8,687,725 B2 | 4/2014 | Mihoto |
| 8,824,529 B2 | 9/2014 | Fukuda et al. |

(Continued)

FOREIGN PATENT DOCUMENTS

| CN | 102035582 A | 4/2011 |
| CN | 102047502 A | 5/2011 |

(Continued)

OTHER PUBLICATIONS

"Japanese Application Serial No. 2014-557957, Office Action mailed Nov. 18, 2015", w/ English Translation, 10 pgs.

(Continued)

*Primary Examiner* — Mohammed Rachedine
(74) *Attorney, Agent, or Firm* — Schwegman Lundberg & Woessner, P.A.

(57) ABSTRACT

The present disclosure provides a millimeter-wave waveguide communication system. The millimeter-wave waveguide communication system may comprise: a clock component, and at least two sets of millimeter-wave receiving/transmitting channels. The clock component is configured to provide a clock signal to sending ends and receiving ends of the two sets of millimeter-wave receiving/sending channels respectively. Each set of millimeter-wave receiving/sending channels comprises: a transmitter component, a receiver component and a transmission waveguide. The transmission waveguide is located between the transmitter component and the receiver component and is configured to provide a channel for millimeter-wave transmission. The top face, side face and/or bottom face of the transmission waveguide, except for active devices and accessories thereof, are plated with a metal conductive wall to form an electromagnetic shield from a transmission waveguide in an adjacent millimeter-wave receiving/sending channel. The metal conductive wall can minimize the crosstalk between the channels during high-speed communications, thereby improving data bandwidth and data throughput of the millimeter-wave communication system.

11 Claims, 3 Drawing Sheets

(51) Int. Cl.
*H04B 10/90* (2013.01)
*H05K 1/02* (2006.01)
*H04B 10/00* (2013.01)

(52) U.S. Cl.
CPC ......... *H05K 1/0218* (2013.01); *H05K 1/0239* (2013.01); *H05K 2201/037* (2013.01); *H05K 2201/0715* (2013.01); *H05K 2201/10098* (2013.01)

(56) References Cited

U.S. PATENT DOCUMENTS

| | | | |
|---|---|---|---|
| 2009/0087137 A1* | 4/2009 | Doan | B82Y 20/00 385/14 |
| 2011/0068990 A1 | 3/2011 | Grzyb et al. | |
| 2011/0181375 A1 | 7/2011 | Ma et al. | |
| 2011/0199972 A1* | 8/2011 | Warke | H01Q 3/26 370/328 |
| 2013/0135159 A1 | 5/2013 | Goebel et al. | |

FOREIGN PATENT DOCUMENTS

| | | |
|---|---|---|
| CN | 102122743 A | 7/2011 |
| CN | 102148620 A | 8/2011 |
| JP | 2005142884 A | 6/2005 |
| JP | 2007259046 A | 10/2007 |

OTHER PUBLICATIONS

Suntives, Asanee, et al., "Ultra-High-Speed Multichannel Data Transmission Using Hybrid Substrate Integrated Waveguides", *IEEE Transactions on Microwave Theory and Techniques*, vol. 56, No. 8, (Jul. 25, 2008), 1973-1984.

"Machine Translation of CN 102035582A, published Apr. 27, 2011", 49 pgs.

"Machine Translation of CN 102047502A, published May 4, 2011", 25 pgs.

"Machine Translation of CN 102122743A, published Jul. 13, 2011", 3 pgs.

"Machine Translation of CN 102148620A, published Aug. 10, 2011", 4 pgs.

Fukuda, Satoshi, et al., "A12.5+12.5 Gb/s Full-Duplex Plastic Waveguide Interconnect", *IEEE Journal of Solid-State Circuits*, 46(12), (2011), 3113-3125.

Fukuda, Satoshi, et al., "A 12.5+12.5Gb/s full-duplex plastic waveguide interconnect", *2011 IEEE International Solid-State Circuits Conference Digest of Technical Papers (ISSCC)*, (2011), 150-152.

Li, Yuan, et al., "Design and Characterization of W-Band Micromachined Cavity Filter Including a Novel Integrated Transition From CPW Feeding Lines", *IEEE Transactions on Microwave Theory and Techniques*, 55(12), (Dec. 2007), 2902-2910.

Okada, Kenichi, et al., "A 60GHz 16QAM/8PSK/QPSK/BPSK Direct-Conversion Transceiver for IEEE 802.15.3c". *2011 IEEE International Solid-State Circuits Conference Digest of Technical Papers (ISSCC)*, (2011), 160-161.

\* cited by examiner

MILLIMETER-WAVE WAVEGUIDE COMMUNICATION SYSTEM

CROSS-REFERENCE TO RELATED APPLICATION

This application is a U.S.National Stage application filed under 35 U.S.C. §371 from PCT Application No. PCT/CN2012/071558, filed on Feb. 24, 2012 and published as WO 2013/123667 A1 on Aug. 29, 2013, which application and publication are incorporated herein by reference in their entireties.

TECHNICAL FIELD

The present invention relates to millimeter-wave communication in information electronic industry, and more particularly, to a millimeter-wave communication system for data transmission between two points over a millimeter-wave waveguide. The millimeter-wave communication system may serve as a bus for high-speed data transmission between a processor and a memory.

BACKGROUND

A conventional hardware part of a computer is generally based on three kinds of common technologies: silicon for forming a transistor for logical operation, a memory and a signal amplifier; composite materials for isolating discrete component integrations; and copper for data transmission. Emergence of multi-core processors, concurrent and simultaneous execution of instructions, and development of software optimization improve a computer performance, while bringing higher requirement for computer hardware.

There is no more effective alternative for silicon based Complementary Metal-Oxide-Semiconductor (CMOS) transistor manufacturing process. Also, research and development for composite materials grows slowly. The data transmission becomes a main factor to limit the computer performance. For on-chip and on-board high-speed data transmission, when a signal rate is close to $10 \times 10^9$ bits/s, inherent characteristics of transmission lines such as skin effect and self-induction effect are becoming significant. It is difficult to distinguish between transmitted bits, probability of correct decoding is reduced, and signal integrity deteriorates seriously. When being transmitted on a transmission line, square wave may become wider and weaker. Sometimes, dispersion effect of a substrate should be stronger than that of copper transmission line, thereby further limiting the system performance. These factors reduce transmission distance of copper wire. In general, these problems may be addressed with pre-distortion, an active amplitude equalizer and a clock recovery, etc. However, circuit modules for the clock recovery, the active equalizer and preprocessor will increase corresponding power consumptions. In addition, in order to obtain higher throughput, it is not feasible to only increase a diameter of the copper bus. This is because the increased diameter of the bus and the reduced number of channels may cause the power consumption be increased, as well as the number of input/output ports requiring for grounding be increased.

Optical bus is a potential alternative for copper bus. In a multimode optical fiber or a polymer waveguide that has no bad attenuation or distortion on a signal of a band, a transmission distance of the signal can reach a few centimeters or even a few meters. However, transmission of a single bit in optical bus consumes more energy. While a new laser source can be directly modulated to $30 \times 10^9$ b/s and have sufficient reliability, it is expensive and may bring uncertainty. Among things, there is no reliable and economic integration process in mass production for the optical bus.

An article by Satoshi Fukuda, et al. entitled "A 12.5+12.5 Gb/s Full-Duplex Plastic Waveguide Interconnect" (ISSCC2011) introduces a millimeter-wave waveguide communication system. FIG. 1 shows a structural schematic diagram of a transmission waveguide in the existing millimeter-wave waveguide communication system. As shown in FIG. 1, the transmission waveguide employs plastic material with a dielectric constant of Er=2.6. Each plastic waveguide has a width of 8 mm and a thickness of 1.1 mm. An offset at a signal feed is 2 mm. Most of millimeter-waves transmitted through the plastic waveguide are confined within the plastic waveguide. Moreover, the above scheme employs the commonly configured circuit modules as RF transmitter/receiver, and uses an injection-locking approach instead of a phase-locked loop of high energy consumption to generate a synchronization carrier.

However, there are technical drawbacks in the above millimeter-wave communication system. Firstly, there is millimeter-wave leakage on an outer surface of the plastic waveguide, thereby resulting in a leaked electric field around the plastic waveguide, which extends about one wavelength. In order to reduce coupling of the leaked electric field, there must be enough distance between waveguides, which indirectly increases size of the waveguides and reduces the number of the waveguides. Secondly, there is millimeter-wave reflection on both ends of the waveguide, which leads to a decline in quality of a signal transmitted. Thirdly, the plastic waveguide has a low refractive index, which leads to an increased characteristic size of a signal channel, an increased size of the waveguide, and the reduced number of waveguides within a limited range. Next, a mixer and a voltage-controller oscillator for generating a millimeter-wave carrier are formed with circuits, so that the power consumption and noise of the whole millimeter-wave communication system are increased, especially a phase noise of a demodulation circuit is increased, thereby leading to an increased bit error rate and indirectly affecting a modulation rate of the signal transmitted. All of the above four technical drawbacks may affect data bandwidth, reduce the overall data throughput, and can't be adapted to a system such as a high performance computer.

SUMMARY

(1) Technical Problems to be Solved

Aiming at the above problems, the present disclosure provides a millimeter-wave communication system for improving data bandwidth and data throughout of the communication system.

(2) Technical Solutions

According to an aspect of the present disclosure, a millimeter-wave waveguide communication system is provided. The millimeter-wave waveguide communication system may comprise a clock component and at least two sets of millimeter-wave receiving/transmitting channels. The clock component is configured to provide a clock signal to sending ends and receiving ends of the two sets of millimeter-wave receiving/sending channels, respectively. Each set of millimeter-wave receiving/sending channels may comprise: a transmitter component, a transmission waveguide, and a receiver component. The transmitter component is configured to modulate a synchronization carrier signal of a sending end by using a signal to be transmitted so as to generate a millimeter-wave signal, and to couple the millimeter-signal to the transmission waveguide. The receiver component is configured to detect, from the transmission waveguide, the millimeter signal carrying the signal to be transmitted, to demodulate the millimeter signal by using a synchronization carrier signal of a receiving end, and to obtain the signal to be transmitted. The transmission waveguide is located between the transmitter component and the receiver component and is configured to provide a channel for millimeter-wave transmission. A top face, a side face and/or a bottom face of the transmission waveguide, except for active devices and accessories thereof, are plated with a metal conductive wall to form an electromagnetic shield from a transmission waveguide in an adjacent millimeter-wave receiving/sending channel.

(3) Technical Effects

The millimeter-wave waveguide communication system of the disclosure operates at a millimeter-wave frequency band, and the modulated millimeter wave is transmitted over the transmission waveguide. The millimeter-wave waveguide communication system according to the present disclosure has benefit effects as follows:

(1) The surface of the transmission waveguide, except for active devices and accessories thereof, is plated with a metal conductive wall, thereby leading to shielding between signal channels. This can minimize a crosstalk between channels during high-speed communication.

(2) A reflection suppressed structure is formed on both sides of the transmission waveguide to suppress millimeter-wave reflection, which improves quality of a signal to be transmitted.

(3) Materials of high refractive index, such as silicon, ceramics, etc, are configured to manufacture the transmission waveguide. In this way, a wavelength of a signal transmitted therein becomes shorter, a characteristic size of a signal channel becomes smaller, and an integration level becomes higher. Therefore, interconnection requirements such as high density and high speed may be satisfied.

(4) The global optical clock provides a clock signal, which is network coherent and frequency auto-tracking and has low phase noise. Therefore, for high-order digital modulation, such as 64 Quadrature Amplitude Modulation (QAM), a low bit error rate may be obtained, thereby achieving an extremely high data transmission rate.

REFERENCE SIGNS

100 transmission waveguide;
   100*a*, 100*b* and 100*c* top face, bottom face and side face of the transmission waveguide;
   100*d* end face of the waveguide;
110 reflection suppressed structure;
210 millimeter wave transmitter;
220 signal transmitting antenna;
221 conductive part of signal transmitting antenna;
222 isolating part of signal transmitting antenna;
310 millimeter wave receiver;
320 signal receiving antenna;
321 conductive part of signal receiving antenna;
322 isolating part of signal receiving antenna;
400 clock system
410 global optical clock
411 input optical fiber;
412 a first set of input coupling prisms;
413 polarizer;
414 gyrotropic crystal;
415 modulated signal;
416—reference voltage source;
417 polarizer with a 90-degree polarization relative to 403;
418 a second set of output coupling prisms;
419 output optical fiber;
420 optical fiber;
430 sending end optical detector;
440 receiving end optical detector;
510 3D stacked memory circuit;
520 electrical signal line;
530 vertical conductive structure;
540 synchronization carrier signal of sending end;
550 synchronization carrier signal of receiving end;
560 processor circuit.

DETAILED DESCRIPTION OF THE EMBODIMENTS

In order to make the objects, technical solutions, and advantages of the present disclosure more apparent, further detailed descriptions will be made in conjunction with specific embodiments with reference to drawings. While examples of parameters containing specific values may be provided here, it should be appreciated that it is unnecessary for parameters to be exactly equal to corresponding values, but may approximate the values in an acceptable error margin or design constraints.

In the millimeter-wave waveguide communication system according to the present disclosure, a conductive wall is formed on a surface of the waveguide for avoiding leakage of millimeter wave and reducing coupling of a leaked electric field. A structure for preventing millimeter wave reflection is designed on an end face of the waveguide, thereby improving quality of signal transmission. A waveguide of silicon is employed to improve integration of the transmission waveguide. Further, a global optical clock may provide transmitter component and receiver component on each set of millimeter-wave receiving/sending channels with a local clock signal, which is coherent and frequency and auto-phase tracking. As the local clock signal provided by the global optical clock has a low phase noise for higher-order modulation and a lower bit error rate, thereby leading to a high data transmission rate.

Figure 1:
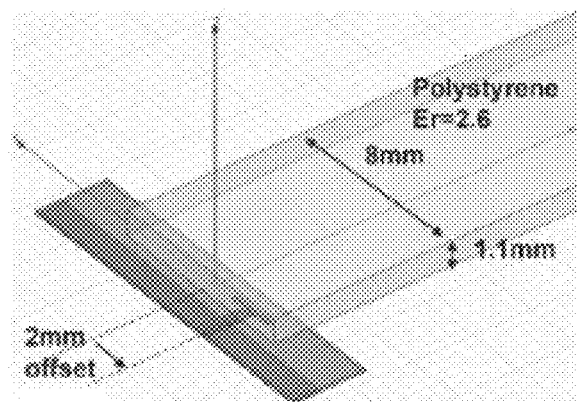
FIG. 1 shows a structural schematic diagram of a transmission waveguide in the conventional millimeter-wave waveguide communication system.
Figure 2:
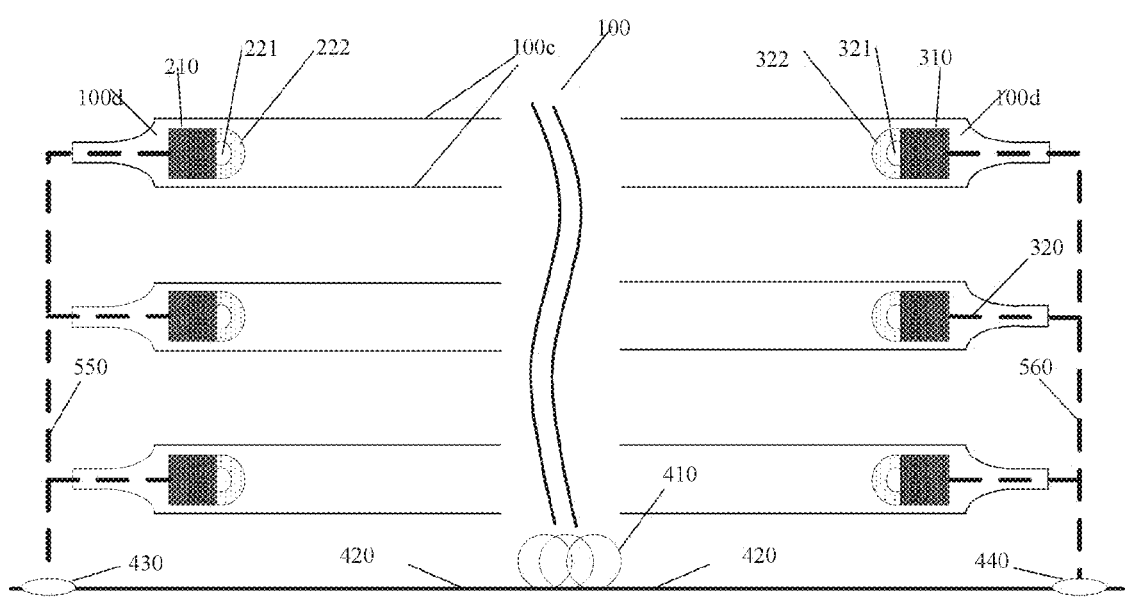
FIG. 2 shows a structural schematic diagram of a millimeter-wave waveguide communication system according to an embodiment of the present disclosure.

In an exemplary embodiment of the present disclosure, a millimeter-wave waveguide communication system is provided. FIG. 2 shows a structural schematic diagram for the millimeter-wave waveguide communication system according to this embodiment of the present disclosure. As shown in FIG. 2, the millimeter-wave waveguide communication system may comprise a clock component and at least two sets of millimeter-wave receiving/sending channels (three sets, as illustrated in FIG. 2, and generally ten to fifty sets in actual applications). Each set of millimeter wave receiving/sending channel may comprise a transmitter component, a transmission waveguide, and a receiver component.

The clock component is provided for providing a synchronization carrier for the transmitter component and the receiver component in each set of millimeter wave receiving/sending channel. In a preferred technical solution of the present disclosure, the clock component may comprise: a global optical clock 410, an optical fiber 420, a sending end optical detector 430, and a receiving end optical detector 440. An optical clock signal generated by the global optical clock 410 is transmitted through the optical fiber 420 to the optical detectors 430 and 440 located at the sending end and the receiving end, respectively. In the optical detectors 430 and 440, the optical clock signal is converted into an electrical clock signal and then distributed to millimeter wave transmitter/receiver in each millimeter receiving/sending channel. To facilitate illustration, the electrical clock signal is denoted by dashed lines, and the optical clock signal is denoted by bold solid lines. Detailed descriptions on a specific structure of the global optical clock will be given below. In a preferred embodiment of the present disclosure, a clock component combining optical and electrical components is configured to provide a synchronization carrier for the millimeter-wave transmitter and the millimeter wave receiver. It should be apparent that when a bandwidth requirement is not high, the synchronization carrier may be provided in a form of only the electrical clock signal, which would not affect implementation of the present invention.

A transmission waveguide 100 is located between a set of millimeter wave transmitter and a set of millimeter wave receiver and configured to provide a channel for millimeter wave transmission. The transmission waveguide 100 used for transmitting millimeter wave may be made of either silicon, or an isolator of a high dielectric constant and low permeability, such as $Al_2O_3$, $SiO_2$, organic polymer (such as lithium niobate, etc.), ceramic material (its major component is $Al_2O_3$, but also includes a small amount of $SiO_2$), etc. Preferably, the transmission waveguide is made of silicon. Transmission loss of millimeter wave in silicon material is about 0.1 dB/cm~0.9 dB/cm. Such a small attenuation characteristic ensures an optimal signal transmission condition in the transmission waveguide.

Figure 3A:
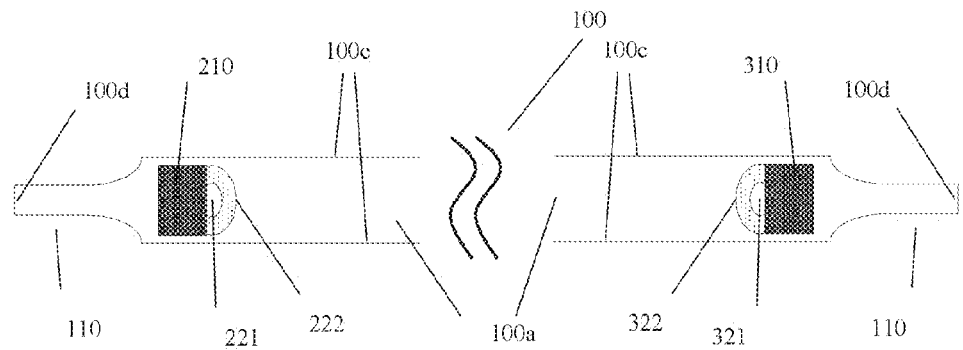
FIG. 3A shows a first cross-section diagram of a transmission waveguide in the millimeter-wave waveguide communication system according to the embodiment of the present disclosure.
Figure 3B:
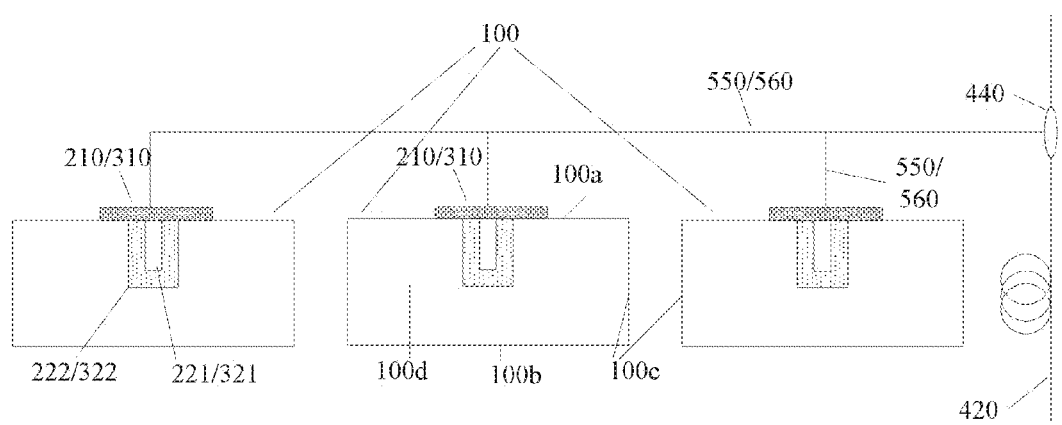
FIG. 3B shows a second cross-section diagram of the transmission waveguide in the millimeter-wave waveguide communication system according to the embodiment of the present disclosure.
Figure 3C:
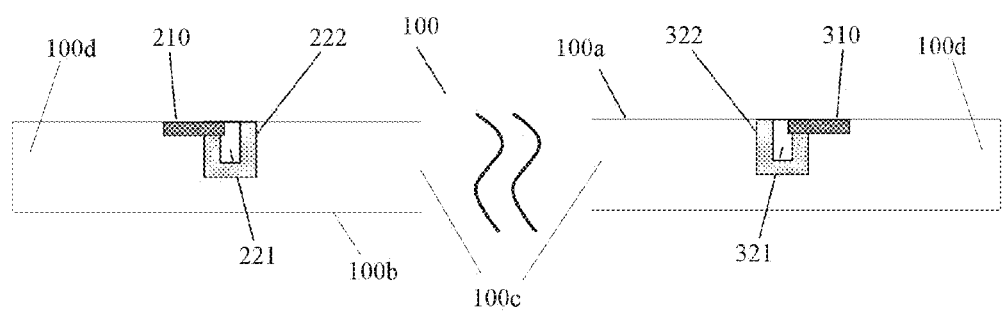
FIG. 3C shows a section diagram of an end of the transmission waveguide in the millimeter-wave waveguide communication system according to the embodiment of the present disclosure.

FIG. 3A shows a first cross-section diagram of a transmission waveguide in the millimeter-wave waveguide communication system according to the embodiment of the present disclosure. FIG. 3B shows a section diagram of an end of the transmission waveguide in the millimeter-wave waveguide communication system according to the embodiment of the present disclosure. FIG. 3C shows a second cross-section diagram of the transmission waveguide in the millimeter-wave waveguide communication system according to the embodiment of the present disclosure. The cross-section of FIG. 3A and that of FIG. 3C are perpendicular to each other.

As shown in FIG. 3A, there is a reflection suppressed structure 110 on both ends of the transmission waveguide. The reflection suppressed structure 110 may be a cone structure formed on the both ends of the transmission waveguide. The cone structure may suppress reflection of millimeter wave. Moreover, a layer of wave-absorbing materials (such as gold, gold, copper, aluminum, etc.) attached onto the both ends of the transmission waveguide may be used for suppressing the millimeter wave reflection.

As shown in FIG. 3B, the transmission waveguide has a width about three times its height. A large number of millimeter wave waveguides may be arranged horizontally in a parallel form or vertically in a stacked form, but not limited to the illustrated three waveguides. Also, the shape of the millimeter wave waveguide may be semicircle, half oval, round or trapezoid, and will be not descried here in detail.

Figure 5:
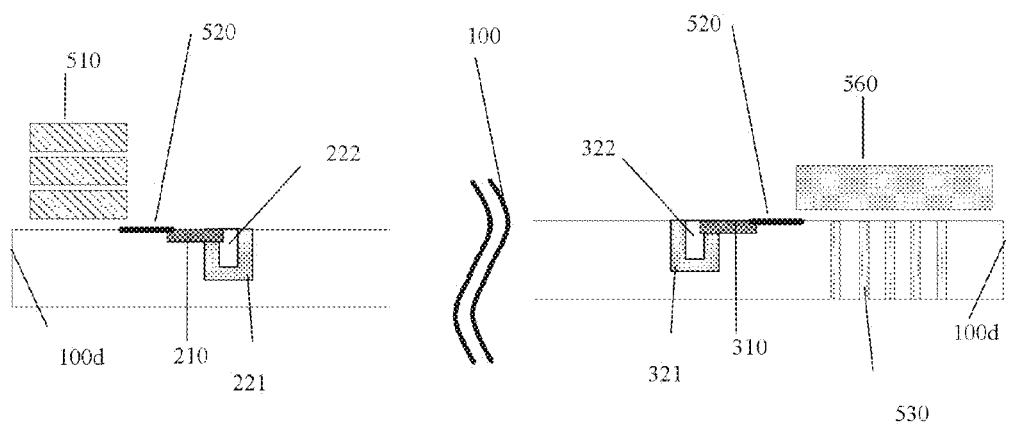
FIG. 5 shows a schematic diagram of integrating the millimeter-wave waveguide communication system of FIG. 2 on a platform of a processor and a memory.

As shown in FIGS. 2, 3A, 3B and 3C, a top face 100a, a side face 100c and/or a bottom face 100b of the transmission waveguide 100 is plated with a layer of metal conductive wall (such as gold, copper, aluminum, etc), to form an electromagnetic shield between transmission waveguides. Of course, it should be understood that active devices (for example a processor or a memory as shown in FIG. 5, or other active chip requiring signal transmission) and accessories thereof cannot be plated with the metal conductive wall, so as to avoid the signals generated by the active devices from being affected. In general, according to process conditions of assembly equipment, an interval of a rectangular waveguide employing the conductive wall may be reduced to 10 microns or less. Moreover, when the transmission waveguide is made of organic polymer materials, it is needed to appropriately control a temperature for forming the metal conductive wall, so as to form the metal conductive wall without destroying the structure of the transmission waveguide.

The transmitter component is configured to module a synchronization carrier signal 540 by using the signal to be transmitted, so as to generate a millimeter wave signal, and to transmit the millimeter wave signal to the transmission waveguide 100. The set of millimeter wave transmitter may comprise a millimeter wave transmitter 210 and a signal transmitting antenna 220.

The receiver component is configured to detect, from the transmission waveguide 100, a millimeter wave signal carrying a signal, and to demodulate the millimeter wave signal by using a synchronization carrier signal 550 of the receiving end, so as to obtain the signal to be transmitted. The set of millimeter wave receiver may comprise a signal receiving antenna 310 and a millimeter wave receiver 320.

In general, the signal transmitting antenna 220 and the signal receiving antenna 310 may be integrated within the transmission waveguide, and the millimeter wave transmitter 210 and the millimeter wave receiver 310 may be integrated onto or into the transmission waveguide by means of a variety of ways, such as a flip chip boding, in which the transmitter component/receiver component is welded onto the top surface of the transmission waveguide by a reflow process to form an electrical contact. Moreover, it is well known for those skilled persons in an art of millimeter wave silicon RF that the millimeter wave transmitter 210 and the millimeter wave receiver 310 may be integrated within the transmission waveguide by means of CMOS process. For example, an article by Kenichi Okada, et al. entitled "A 60 GHZ 16 QAM/8 PSK/QPSK/VPSK, Direct-Conversion Transceiver for IEEE 802.15.3 c" (ISSCC, Page 160, March 2011) introduces a performance of a silicon CMOS in an amplitude and phase modulation system operating at a frequency of 60 GHZ. For simplicity, descriptions will be made in an example where the transmitter component 210 and the receiver component are integrated in the transmission waveguide by means of the CMOS process.

As shown in FIGS. 3A and 3B, the millimeter wave transmitter 210 and the signal transmitting antenna 220, as well as the signal receiving antenna 320 and the millimeter wave receiver 310, are directly integrated onto the waveguide. The signal transmitting antenna 220 may comprise: a conductive part 221, which is integrated within the transmission waveguide and is configured to transmit the millimeter wave signal to the transmission waveguide 100; and an isolating part 222, which is arranged on a periphery of the conductive part 221 of the signal transmitting antenna and configured to implement an electrical isolation between the conductive part 221 of the signal transmitting antenna and the transmission waveguide 100. Similarly, the signal receiving antenna 320 may comprise: a conductive part 321, which is integrated within the transmission waveguide and is configured to detect the millimeter wave signal from the transmission waveguide 100; and an isolating part 322, which is arranged on a periphery of the conductive part 321 of the signal receiving antenna and is configured to implement an electrical isolation between the conductive part 321 of the signal receiving antenna and the transmission waveguide 100.

Transmission and detection of millimeter wave in the transmission waveguide may be implemented by using a variety of ways, which are well known in the art. In the signal coupling field, approaches of coaxial probe antenna, monopole antenna structure and bipolar antenna structure are well known. The coaxial probe antenna may directly feed a millimeter wave signal to a transmission waveguide through an ohmic contact, for example, transmission of the millimeter wave in a microstrip. Recently, an article by John Papapolymerou, et al. entitled "Design and Characterization of a W-Band Micromachined Cavity Filter o a will be Integrated the Transition From CPW bean Lines" (IEEE Transactions and Microwave and Microwave Theory and Techniques, Vol 55, No. 12, Page 2902, December 2007) is a typical example for transmission and detection of millimeter wave by using a coaxial probe. The monopole antenna structure or bipolar antenna structure is used to feed an electromagnetic wave into a transmission waveguide. Then, the transmission of the electromagnetic wave is confined within a size range of the waveguide. An article by Satoshi Fukuda, et al. (IEEE International Solid-State Circuits Conference, Page 150, March 2011) introduces an antenna structure embedded into a millimeter wave waveguide made of polystyrene materials.

Figure 4:
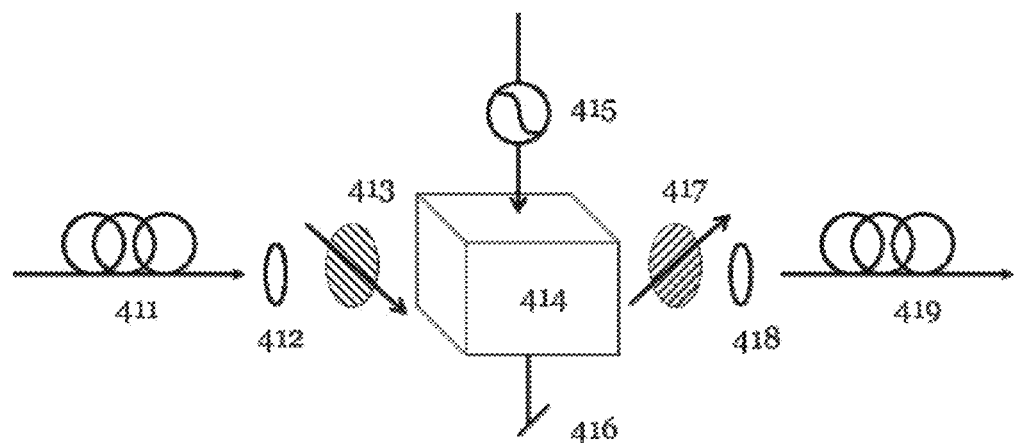
FIG. 4 shows a structural schematic diagram of a global optical clock in a clock component in the millimeter-wave waveguide communication system according to the embodiment of the present disclosure.

In the clock component, the synchronization carrier signal is provided by preferably combining the optical manner and the electrical manner. A shortcoming of high bit error rate may be addressed by means of the global optical clock. The global optical clock may provide the millimeter wave receiving/sending channel with a local electrical clock signal with strong coherence and low phase noise. There are many ways to achieve the global optical clock. FIG. 4 shows a structural schematic diagram of a global optical clock in a clock component in the millimeter-wave waveguide communication system according to the embodiment of the present disclosure. As shown in FIG. 4, the global optical clock may include: an input optical fiber 411, configured to input continuous optical signals; a first set of coupling prisms 412, configured to project an optical signal inputted via the input optical fiber 411 onto a polarizer 413; the polarizer 413, configured to filter out optical signals in polarization directions other than a preset polarization direction, so that the continuous optical signals are converted into continuous polarized optical signals; a gyrotropic crystal 414, located behind of the polarizer 413 along a light path and configured to convert the continuous polarized optical signals into polarized signals of pulses and to deflect the polarization direction of the polarized optical signals 90 degrees, under a control signal of a gyrotropic controller 415; the gyrotropic controller 415, configured to provide a control signal for the gyrotropic crystal; a reference voltage source 416, configured to provide a power supply required by operation of the gyrotropic crystal; a polarizer 417, located behind the gyrotropic crystal 414 along the light path and configured to only allow a polarized light with 90 degrees relative to a polarization direction of the polarizer 413 to pass; a second set of coupling prisms 418, configured to project optical signals outputted from the polarizer 417 onto an output optical fiber 419; and the optical fiber 419, configured to output the synchronization optical clock signal as the optical signals.

Moreover, an optical clock signal may be generated by applying the following approaches: (1) using an optical signal and an external Mach-Zehnder interferometer; (2) directly modulating a positive bias current of a semiconductor laser; and (3) modulating a phase of light transmission in the gyrotropic crystal by using a polarizer, and so on. Principles and specific structures of these types of global optical clocks are well known to those skilled in the art, and will not be described in detail. The known components are applied as the optical fiber 420, the sending end optical detector 430 and the receiving end optical detector 440, and there is no detailed description therefore.

The network coherence and frequency auto-tracking, reducing the number of components in the circuit and reducing power consumption and phase noise are achieved with the global optical clock. In some applications, the power consumption for the system equals to that for the copper bus, or even less. The millimeter wave waveguide communication system may be applied in data "storing" and "fetching" between a main memory and a processor. A key feature of a millimeter wave bus is that it uses the optical clocks widely distributed, so as to simplify the RF circuit system. Furthermore, this may provide high-order modulation with a clock signal of low phase noise, so that a transmission rate of a symbol exceeds $10 \times 10^9$ symbols per second when the bit error rate is lower than $10^{-12}$/s, and each symbol can carry information of 4 or 6 bits. An encoding and decoding scheme such as Phase Shift Keying (PSK) and Quadrature Amplitude Modulation (QAM) may be configured to perform multiple bits encoding on a single symbol. The high-order symbol modulation and the low bit error rate means a high signal-to-noise ratio (S/N) and the low phase noise.

FIG. 5 shows a schematic diagram of integrating the millimeter-wave waveguide communication system of FIG. 2 on a platform of a processor and a memory. As shown in FIG. 5, the transmission waveguide 100 is provided for the millimeter wave transmission, and an interconnection line for re-distribution is configured to interconnect a processor 560 and a 3D stacked memory 510. The 3D stacked memory circuit 510 is connected to the millimeter wave transmitter 210. The millimeter wave transmitter 210 and the millimeter wave receiver 310 perform data transmission through the transmission waveguide 100. The millimeter wave receiver 310 is connected to the processor 560. In addition, FIG. 5 shows a vertical conductive structure 530, which transmits data through a silicon platform. Electrical signal lines 520 represent electrical connections from the memory 510 to the millimeter wave transmitter 210 or from the millimeter wave receiver 310 to the processor 560.

For a packaged processor chip, a length of one side is an order of centimeter, a millimeter wave channel may have a width of 4 cm, and transmission waveguides arranged side by side may reach up to 100 sets, preferably 100, 80, 75, 45, 30, 50, 60, 10, 5, or 2 sets. Table 1 is a table of dimensions of the transmission waveguide in the millimeter wave waveguide communication system, which has been achieved.

TABLE 1 several dimensions of transmission waveguide in the millimeter wave waveguide communication system

| Serial number of waveguide | Side length of processor | Interval of waveguide | Width of waveguide | Height of waveguide | Number of waveguides |
|---|---|---|---|---|---|
| 1 | 4 cm | 0.1 mm | 0.1 mm | 0.05 mm | >50 |
| 2 | 4 cm | 0.1 mm | 0.8 mm | 0.2 mm | >40 |
| 3 | 4 cm | 0.1 mm | 1 mm | 0.2 mm | >30 |
| 4 | 4 cm | 0.1 mm | 2 mm | 0.4 mm | >15 |

Throughout of the millimeter wave waveguide communication system depends on the number of channels in the bus and the throughput of each channel. For the millimeter wave waveguide communication system of the present disclosure, a bandwidth of a single channel can be over 40 Gb/s, which is about 2.5 times the bandwidth of the best copper bus by far. For a single chip, data throughput can reach up to dozens of Tb/s.

The present disclosure may function as a data transmission bus between a processor and a memory. A structure of the bus is formed of an array of waveguides. Digitally encoded millimeter wave is transmitted through the array of waveguides. Moreover, in a high performance system, by introducing the cope of "all silicon data bus", some systems may preserve this kind of bus interface when designing, so that a small standardized computing module can access to the high performance system. Then, such a computing module may become universal.

The foregoing specific embodiments make detailed explanations on the objects, technical solutions and benefit effects of the present disclosure. It should be understood that the above embodiments are provided only to illustrate, rather than limiting, the present invention. Any modifications or equivalent alternatives or improvements can be made to the solutions of the present invention without departing from the spirit and scope of the present invention.

What is claimed is:

1. A millimeter-wave waveguide communication system, comprising a clock component and at least two sets of millimeter-wave receiving and transmitting channels,
wherein the clock component is configured to provide a synchronization carrier signal to sending ends and receiving ends of the at least two sets of millimeter-wave receiving and transmitting channels, respectively; and
each set of millimeter-wave receiving and transmitting channels comprises: a transmitter component, a transmission waveguide, and a receiver component, wherein:
the transmitter component is configured to modulate a synchronization carrier signal of a sending end by using a signal to be transmitted so as to generate a millimeter-wave signal, and to couple the millimeter-signal to the transmission waveguide;
the receiver component is configured to detect, from the transmission waveguide, the millimeter signal carrying the signal to be transmitted, to demodulate the millimeter signal by using a synchronization carrier signal of a receiving end, and to obtain the signal to be transmitted;
the transmission waveguide is located between the transmitter component and the receiver component and configured to provide a channel for millimeter-wave transmission; a top face, at least one of a side face and a bottom face of the transmission waveguide, except for active devices and accessories thereof, being plated with a metal conductive all to form an electromagnetic shield from a transmission waveguide in an adjacent millimeter-wave receiving and transmitting channel;
wherein the clock component comprises:
a global optical clock, configured to generate a synchronization optical clock signal, and to transmit synchronization optical clock signal to the sending ends and the receiving ends of the millimeter-wave waveguide communication system, respectively, over an optical fiber;
a sending end optical detector, located at the sending ends of the millimeter-wave waveguide communication system, and configured to generate a synchronization carrier signal in a form of an electrical signal by using the synchronization optical clock signal, and to transmit the synchronization carrier signal to the transmitter component of the at least two sets of millimeter-wave receiving and transmitting channels; and
a receiving, end optical detector, located at the receiving ends of the millimeter-wave waveguide communication system, and configured to generate a synchronization carrier signal in a form of an electrical signal by using the synchronization optical clock signal, and to transmit the synchronization carrier signal to the receiver component of the at least two sets of millimeter-wave receiving and transmitting channels.

2. The millimeter-wave waveguide communication system of claim 1, wherein the metal conductive wall is made of gold, copper, or aluminum.

3. The millimeter-wave waveguide communication system of claim 1, wherein one or both end-faces of the transmission waveguide comprises a reflection suppressed structure, for suppressing reflection of millimeter-wave within the transmission waveguide.

4. The millimeter-wave waveguide communication system of claim 3, wherein the reflection suppression structure is:
a wave-absorbing layer;
or a cone structure having a end pointing to a far end of the transmission waveguide.

5. The millimeter-wave waveguide communication system of claim 1, wherein the metal conductive wall is made of Si, $AL_2O_3$ or $SiO_2$.

6. The millimeter-wave waveguide communication system of claim 5, wherein the transmission waveguide is a rectangular waveguide having a width between 0.1 mm and 2 mm, which is two to five times its height.

7. The millimeter-wave waveguide communication system of claim 1, wherein the global optical clock comprises:
   an input optical fiber, configured to input continuous optical signals;
   a first set of coupling prisms, located behind light path of the input optical fiber, and configured to project an optical signal inputted via the input optical fiber onto a polarizer;
   the polarizer, located behind the first set of coupling prisms in a light path, and configured to filter out optical signals in polarization directions other than a preset polarization direction, so that the continuous optical signals are converted into continuous polarized optical signals;
   a gyrotropic crystal, located behind the polarizer along the light path and configured to convert the continuous polarized optical signals to pulsed polarized optical signals, and deflect a polarized direction of the polarized optical signals 90 degrees;
   a polarizer located behind the gyrotropic crystal in the light path, and configured to filter out lights other than that polarized light of the polarizer having a polarization direction as 90 degrees;
   a second set of coupling prisms, configured to project optical signals outputted from the polarizer onto an output optical fiber; and
   the optical fiber, configured to output the optical signals as the synchronization optical clock signal.

8. The millimeter-wave waveguide communication system of claim 1, wherein
   the transmitter component comprises a millimeter-wave transmitter and a signal transmitting antenna, wherein the millimeter-wave transmitter is configured to module the synchronization carrier signal of the sending end by using the signal to be transmitted, so as to generate a millimeter-wave signal; and
   the signal transmitting antenna is connected to the millimeter-wave transmitter and configured to couple the millimeter-wave signal to the transmission waveguide; and
   the receiver component comprises a signal receiving antenna and a millimeter-wave receiver, wherein the signal receiving antenna is configured to detect, from the transmission waveguide, the millimeter signal carrying a signal; and the millimeter-wave receiver is configured to demodulate the millimeter-wave signal by using the synchronization carrier signal of the receiving end, so as to obtain the signal to be transmitted.

9. The millimeter-wave waveguide communication system of claim 8, wherein
   the signal transmitting antenna and the signal receiving antenna are integrated within the transmission waveguide; and
   the transmitter component and the receiver component are integrated onto the transmission waveguide with a flip chip bonding process, or are integrated within the transmission waveguide with a CMOS process.

10. The millimeter-wave waveguide communication system of claim 9, wherein
   the signal transmitting antenna comprises: a first conductive part configured to couple the millimeter-wave signal into the transmission waveguide; and a first isolating part arranged on a periphery of the first conductive part and configured to implement an electrical isolation between the first conductive part and the transmission waveguide; and
   the signal receiving antenna comprises: a second conductive part configured to detect, from the transmission waveguide, the millimeter-wave signal carrying a signal; and a second isolating part arranged on a periphery of the second conductive part and configured to implement an electrical isolation between the second conductive part and the transmission waveguide.

11. The millimeter-wave waveguide communication system of claim 1, wherein the millimeter-wave waveguide communication system comprise 2-100 millimeter-wave receiving and transmitting channels for data transmission between a processor and a memory.

* * * * *